United States Patent [19]

Garnett

[11] Patent Number: 5,047,820
[45] Date of Patent: Sep. 10, 1991

[54] SEMI SELF-ALIGNED HIGH VOLTAGE P CHANNEL FET

[75] Inventor: Martin E. Garnett, Los Gatos, Calif.
[73] Assignee: Micrel, Inc., Sunnyvale, Calif.
[21] Appl. No.: 523,289
[22] Filed: May 11, 1990

Related U.S. Application Data

[63] Continuation of Ser. No. 244,207, Sep. 14, 1988, abandoned.

[51] Int. Cl.$^5$ .............. H01L 29/10; H01L 29/68; H01L 29/06
[52] U.S. Cl. .............. 357/23.8; 357/23.4; 357/23.9; 357/23.11; 357/20
[58] Field of Search .............. 357/23.3, 23.4, 23.8, 357/23.9, 23.11, 20, 23.1, 23.13, 34

[56] References Cited

U.S. PATENT DOCUMENTS

| | | | |
|---|---|---|---|
| 4,092,661 | 5/1978 | Watrous, Jr. | 357/23.9 |
| 4,108,686 | 8/1978 | Jacobus, Jr. | 357/23.9 |
| 4,520,553 | 6/1985 | Kraft | 357/23.9 |
| 4,811,075 | 3/1989 | Eklund | 357/23.8 |
| 4,823,173 | 4/1989 | Beasom | 357/23.8 |

FOREIGN PATENT DOCUMENTS 2045525 10/1980 United Kingdom .............. 357/23.8

OTHER PUBLICATIONS

S. M. Sze, *Semiconductor Devices, Physics and Technology*, John Wiley & Sons, New York (1985), p. 209.
Micrel MPD 8020 Data Sheet, Micrel, Inc., undated.
Micrel MIC 8030-50V Data Sheet, Micrel, Inc., undated.
Proceedings of the Symposium on High Voltage and Smart Power Devices, vol. 87-13, ECS, 1987, pp. 1-67, see especially pages 15, 35-37 and 47-48.
"Integrated High Voltage/Low Voltage MOS Devices," S. Buhler et al., IEEE, IEDM81, pp. 259-262, Jul. 1981.
"A 1000V High Voltage P-Channel DSAMOS-IC", K. Nakagawa et al., IEEE, IEDM82, pp. 72-75, May 1982.
"HV Array Adds Semicustom Chips to a Power Designer's Toolbox," Electronics Design, Aug. 6, 1987.
"Integrated High and Low Voltage CMOS Technology," V. Rumennik et al., IEEE, IEDM82, pp. 77-80, May 1982.
"Process and Device Design of a 1000 Vole MOS IC", T. Yamaguchi et al., IEEE, IEDM81, pp. 255-258, Jul. 1981.

*Primary Examiner*—J. Carroll
*Attorney, Agent, or Firm*—Skjerven, Morrill, MacPherson, Franklin & Friel

[57] ABSTRACT

An improved process to fabricate a high breakdown voltage MOSFET is disclosed. The process self-aligns the channel to the source and drain and semi self-aligns the gate electrode to the channel. The MOSFET also includes a boron field implant to extend the source and drain. A high voltage gate oxide can be provided.

7 Claims, 4 Drawing Sheets of Ser. No. 07/244,207, filed 9/14/88 abandoned.

SEMI SELF-ALIGNED HIGH VOLTAGE P CHANNEL FET

This application is a continuation of Ser. No. 07/244,207, filed 9/14/88 abandoned.

BACKGROUND OF THE INVENTION

1. Field of the Invention

This invention relates to an improvement in high voltage field effect and bipolar transistors and in particular to a high voltage MOSFET transistor having a gate electrode semi self-aligned to the channel.

2. Description of the Prior Art

Several examples of prior art high voltage field effect transistors are disclosed in the ECS (Electro Chemical Society) Proceedings Volume 87-13: *Proceedings of the Symposium on High Voltage and Smart Power Devices,* May, 1987, pages 1-67.

The high voltage P channel devices disclosed in the above-cited prior art share several characteristics:

1. All use thin gate oxide, not thick oxide.
2. All use some form of drain extension to obtain high breakdown voltage.
3. All have source metal extended over and past the edge of the gate towards the drain.
4. None use a deep P- region on the source side.

A problem encountered with the prior art is that the prior art transistors generally use a "Drain Extension" region which is not self-aligned to the source, which results in variations in channel length and thus variations in output characteristics. The polysilicon gate is also not self-aligned, thus requiring adequate overlap to be built into the design rules, and thus requiring a larger device.

A second problem is that in the prior art the "Drain Extension" region may require an additional mask step in the fabrication process.

Another prior art device is disclosed by Tadanori Yamaguchi and Seiichi Morimoto in "Process and Device Design of a 1000-Volt MOS IC" in 1981 *Proceedings of the IEEE IEDM* (International Electron Devices Meeting) pages 255-258. Yamaguchi et al. disclose a MOS transistor which can maintain a breakdown of 1000 volts. Yamaguchi et al. use an implanted extension of the source region and an extension also of the drain region. (see FIG. 1) The channel is self-aligned with the source region and with the drain extension. Field oxide covers both the source extension and drain extension regions, and the source metallization covers the gate region. The gate oxide is 1050 Å thick. Yamaguchi et al.'s drain extension region has two subregions, with differing dopant concentrations.

The extension of source metal over the gate is disclosed in Yamaguchi et al., supra. This metal extension serves as a field plate, allowing the high electric fields to be dropped across the thick oxide between drain and the field plate rather than the thin oxide between drain and gate, thus preventing the field plate (poly gate) induced breakdown due to the thin gate oxide.

The prior art devices exhibit breakdown voltages from 180 to 1000 volts. Micrel Inc. has fabricated and sold its MPD 8020 and MPD 8030 High Voltage integrated circuits. Both of these products are fabricated by a high voltage P channel (HVPCH) process with a standard field oxide as gate oxide. The MPD 8020 and the related process are disclosed in copending U.S. patent application No. 07/236,656, entitled "User Configurable Integrated Power Circuit," filed Aug. 25, 1989, inventors: Zinn, et al., now abandoned.

SUMMARY OF THE INVENTION

The present invention overcomes the deficiencies of the prior art by means of the self-alignment of channel to source and drain and "semi self-alignment" of the gate polysilicon to the channel.

The present invention uses a boron field implant mask as the source and drain extension mask. This boron field mask and implant is a normal part of a standard CMOS silicon gate process, and it is therefore not an extra step to create the high voltage P channel (HVPCH) MOSFET.

In accordance with the present invention, a high voltage P channel MOSFET is formed in which the channel length is determined by the active area (or source-drain) mask which is a silicon nitride masking step normally used in CMOS silicon gate processes. Other source-drain geometries define the source and drain contacts of the MOSFET. The boron field implant mask, also a standard masking step, is defined as a blanket open geometry over the MOSFET, so that the boron field implant becomes the extended source and extended drain of the MOSFET. Standard field oxide is grown. A high voltage gate mask is used to remove the nitride masking layer over the channel and grow a thick high voltage gate oxide, the thickness determined by TDDB (time dependent dielectric breakdown) requirements of the high voltage gate. Alternatively, standard thickness CMOS gate oxide can be grown, to form a MOSFET with a high breakdown voltage and CMOS (low voltage) threshold or to form a bipolar PNP transistor. In either MOSFET embodiment, the polysilicon gate is "semi self-aligned" to the channel, because the gate polysilicon terminates over thick field oxide at the gate's source end and drain end. These overlap regions act as a low gain, low capacitance, high threshold parasitic device, with the dominant device defined by the polysilicon gate over the gate oxide which in turn is over the source-drain defined channel.

The present invention has at least these advantages over the above-described prior art:

The gate oxide can be of any desired thickness, up to the field oxide thickness.

Only one boron field implant step is needed.

There is only one semi-critical mask alignment step, which is the gate polysilicon mask alignment to the source-drain channel areas. Since the poly edge is on a thick oxide field, this alignment is not too critical.

The gate oxide thickness exists only directly over the channel; outside the channel, the gate polysilicon overlaps the thicker field oxide.

Thus the effective length of the channel is defined by the distance between the field oxide at the gate's source end and the field oxide at the drain end.

As described above, the channel is self-aligned to the source and drain, and "semi-self aligned" to the gate.

The channel length can be strictly determined by one layer, the source-drain or active area.

This above-described process is easily integrated into a Smart Power ™, VDMOS, CMOS, or bipolar transistor fabrication process. That is, the transistor of the present invention can be fabricated simultaneously with conventional semiconductor devices, on the same chip.

DETAILED DESCRIPTION OF THE INVENTION

Figure 1:
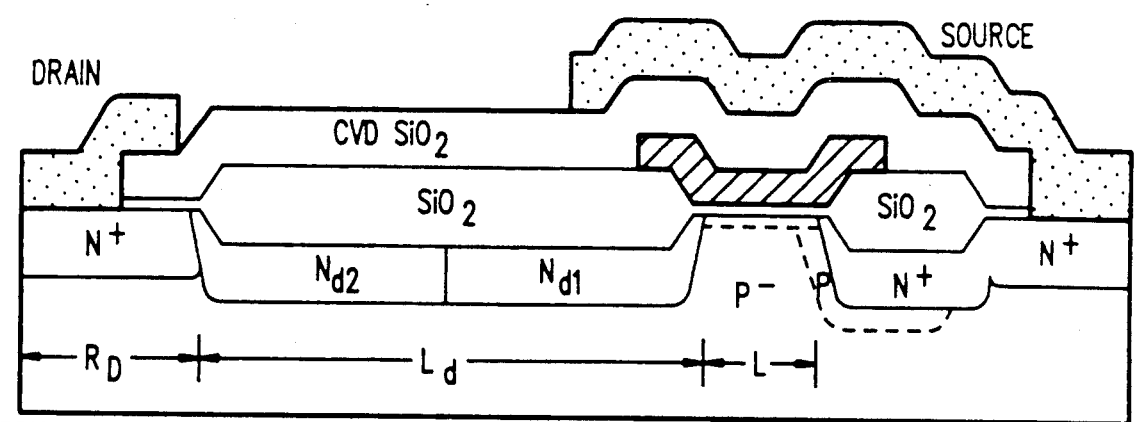
FIG. 1 is an example of the prior art.
Figure 2:
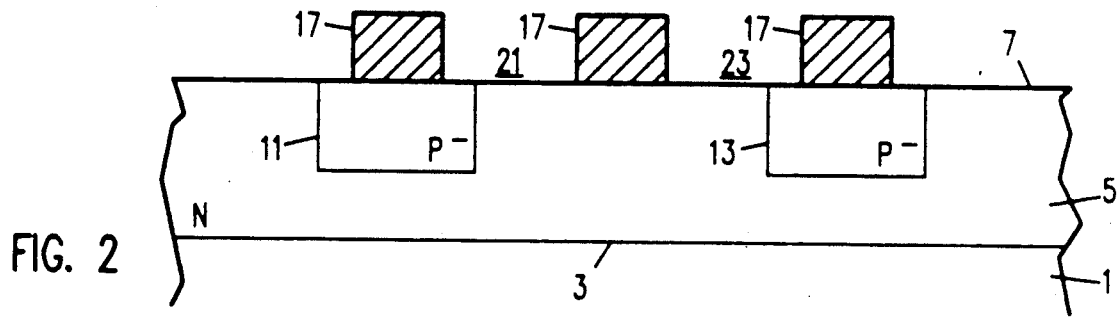
FIGS. 2–8 depict process steps in making an FET embodiment of the present invention.

Beginning with a semiconductor wafer 1 as shown in FIG. 2, typically P type silicon with a <100> surface orientation, and a resistivity of typically 5 to 50 ohm cm and having a surface 3, an epitaxial layer 5 having an N conductivity type is grown by conventional methods on the wafer surface 3. Using conventional methods, a silicon dioxide P well masking layer (not shown) is deposited on surface 7 of the epitaxial layer 5. The silicon dioxide P well masking layer is then patterned by conventional methods so as to expose two areas (not shown) of the epitaxial surface 7. Boron is then implanted in the two exposed areas and driven in so as to form two P− wells 11,13 by conventional methods. The P− well masking layer is then removed.

A source-drain silicon nitride masking layer 17 is then deposited on the surface 7 of the epitaxial layer 5, and source-drain masking layer 17 is patterned by a source-drain mask to define the areas 21,23 that will define the source-channel-drain spacing of the FET. Formation of the source and drain are described below. The source-drain mask is aligned to the previously formed P− wells 11,13. The tolerance of this alignment is such that in the finished device P− well 11 extends at least 1 micron beyond the source region on all four sides of the source region at the principal surface 7, and P− well 13 extends a similar distance beyond the drain region on all four sides of the drain region.

Figure 3A:
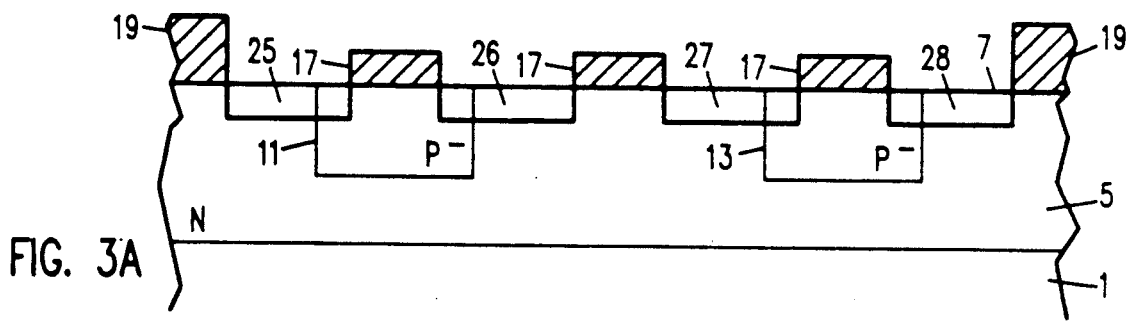
FIG. 3B is a top view of the process step shown in FIG. 3A.
Figure 3B:
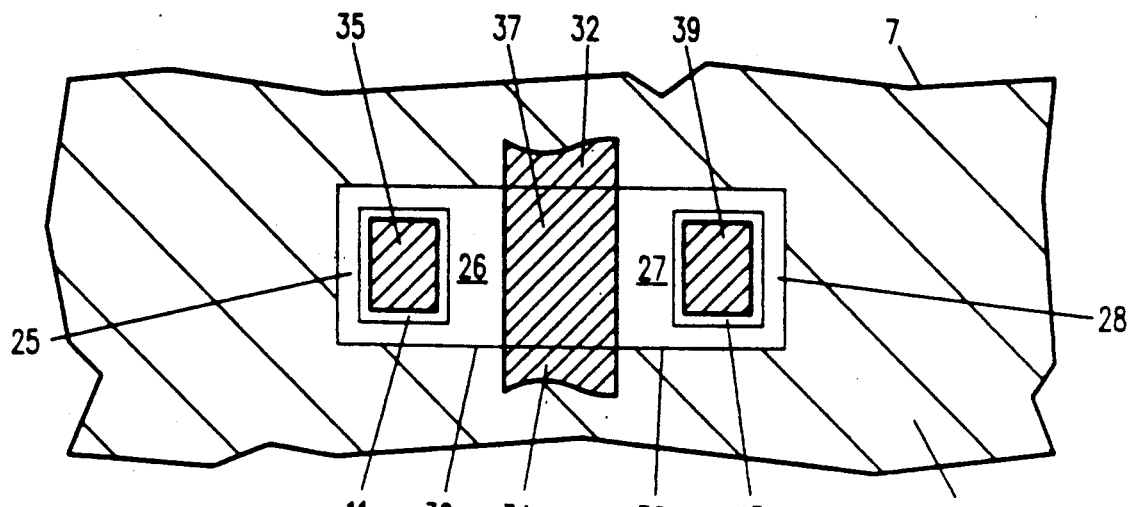
Figure 4:
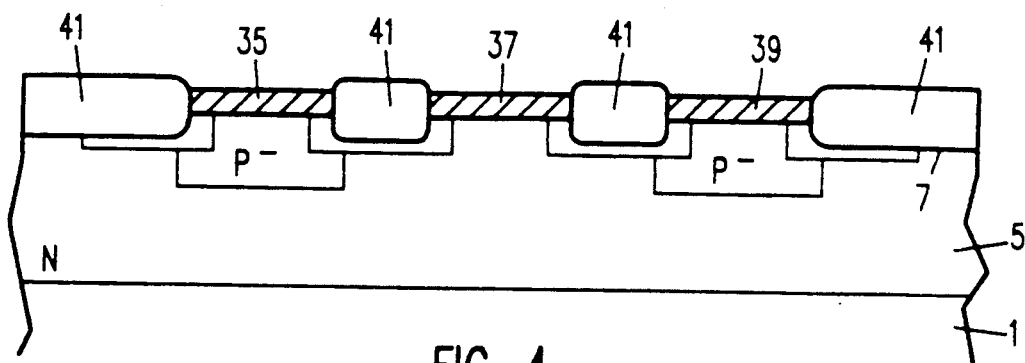

Then a boron field mask 19 in one embodiment is used as a resist masking layer (with no etch process) so as to define the locations of the boron field regions, 25, 26, 27, 28 as shown in FIG. 3A. Then the boron field regions 25, 26, 27, 28 are formed by implanting boron ions, in one embodiment at a dose of about $5 \times 10^{13}/cm^2$ and an energy of 35 KEV. The mask defining the boron field regions 25, 26, 27, 28 is aligned to either the P−, wells 11,13 or to the source-drain-channel areas 21,23. Note that the boron field regions 25 and 26, and 27 and 28 are actually just two regions, meeting outside the plane of FIG. 3A. See FIG. 3B, showing a top view of FIG. 3A. The boron field regions 25, 26, 27, 28 are a blanket open geometry over the transistor. That is to say, the boron field regions 25, 26, 27, 28 as shown in FIG. 3B together form one rectangular (or oval) area 30 open over the entire masked source 35, channel 37, and drain 39 areas. Note that in FIG. 3B, for a non-oval device, channel area 37 has extensions 32 and 34 that extend beyond the edge of boron field 30. Channel extensions 32 and 34 prevent the boron field 30 from electrically shorting the source 35 and drain 39 areas in the completed device. The amount that channel extensions 32 and 34 extend beyond boron field 30 is a matter of process alignment tolerances. Therefore, the boron field mask alignment is not a critical step. Boron field masking layer 19 is then removed. As shown in FIG. 4, a layer of silicon dioxide 41 is then grown over the surface 7 by conventional methods, covering the entire surface 7 except for the silicon nitride masked source, channel and drain areas 35,37,39. Silicon dioxide layer 41 in one embodiment is about 10,000 Å thick, and is the field oxide layer.

Figure 5:
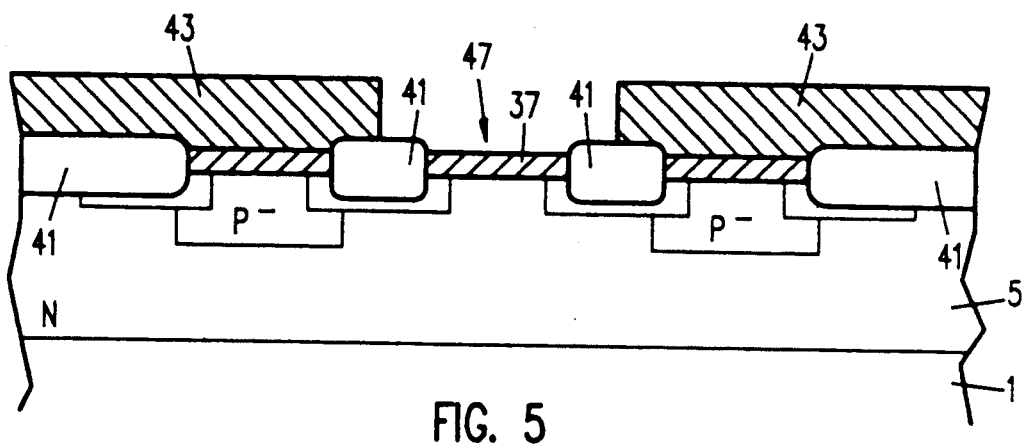

Then, in one embodiment as shown in FIG. 5, a gate oxide masking layer 43 of photoresist is deposited over the entire structure and patterned by a gate oxide mask so as to expose only the area 47 that is to be the gate of the transistor. This gate oxide mask is aligned to the channel area 37 and the alignment of the gate oxide mask is a noncritical step.

Gate oxide masking layer 43 thus removes the original silicon nitride masking layers 35, 37, 39 only from area 37, which will become the high voltage gate region. Thus gate oxide can later (see below) be grown over the channel area 37 without growing any oxide over the active areas 35 and 39 which are still protected by the original silicon nitride masking layer.

Figure 6:
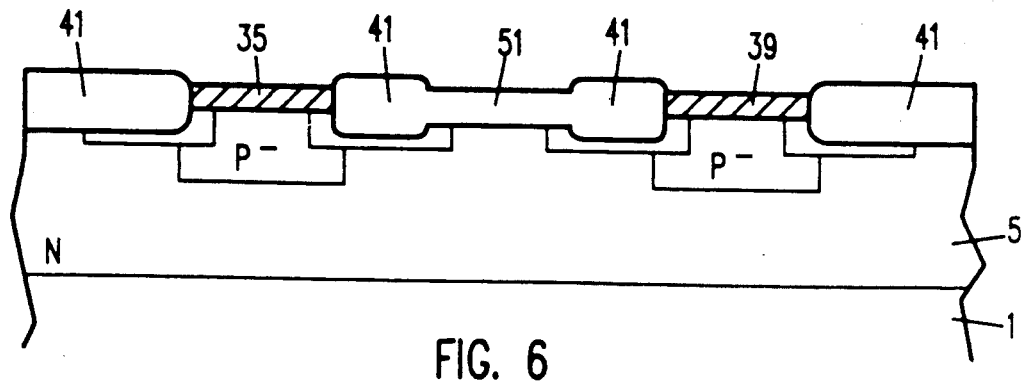

The silicon nitride masking layer over the channel area 37 is removed. A blanket threshold adjust implant (not shown) can be done at this point without affecting any other devices in the integrated circuit. This implant is conventional, and serves to reduce the threshold voltage of the completed device. Then as shown in FIG. 6, a silicon dioxide gate layer 51 is grown by conventional methods to a thickness determined by the device gate voltage required. In one embodiment, a thickness of about 4000 Å is adequate for a gate voltage of 115 volts. The silicon dioxide gate layer 51 can be grown to any desired thickness since it is formed as an independent process step.

Figure 7:
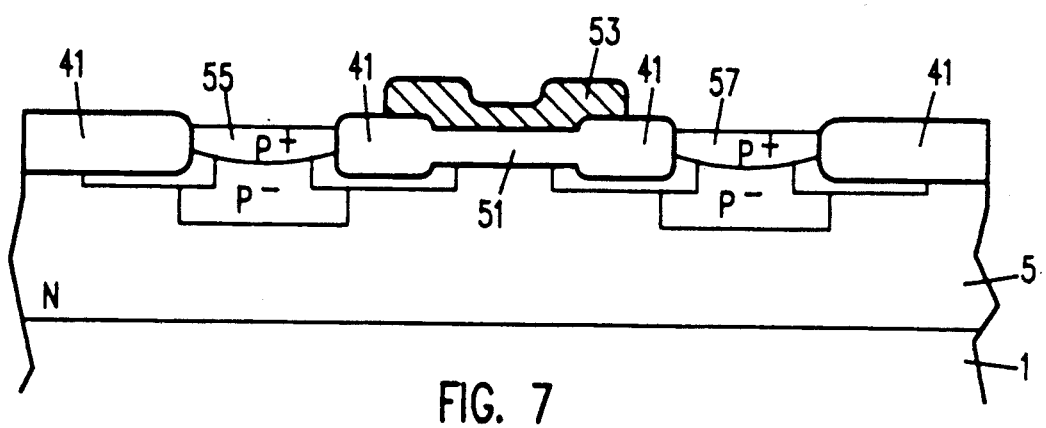

Conventional silicon gate PMOS or CMOS processing then continues, with removal of the remaining silicon nitride masking layer over regions 35 and 39, CMOS threshold adjust implants, and growth of any desired silicon dioxide gate dielectric for any CMOS devices being fabricated (not shown). Then a layer of polycrystalline silicon 53 is deposited and patterned by conventional masking methods to form the gate electrode as shown in FIG. 7. Polycrystalline 2 7 gate electrode layer 53 is, in one embodiment, 5000 Å thick. The gate electrode mask is aligned on the source and drain areas 35,39.

Figure 8:
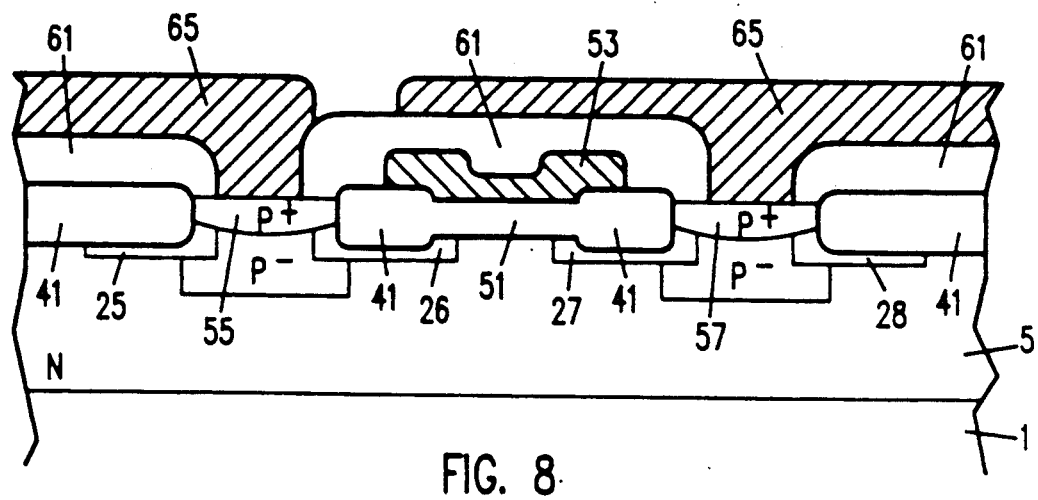

Then the P+ source 55 and drain 57 regions are formed by implanting and driving in boron by conventional means. Since the entire surface of the epitaxial layer 5 (except for the source and drain areas) is covered by oxide layers 41 and 51, the source 55 and drain 57 regions are self-aligned to the channel, while the gate electrode 53 is "semi self-aligned" to the channel. As shown in FIG. 8, a layer of silicon dioxide 61 is deposited over the entire structure by low pressure chemical vapor deposition (LPCVD).

Openings (not shown) are made in LPCVD oxide layer 61 to expose portions of source 55 and drain 57 regions. At this time, the source 55 and drain 57 regions are metallized by deposition of a layer of aluminum 65 which is patterned so that, in one embodiment, source metal 65 extends over the gate electrode 53.

Figure 9:
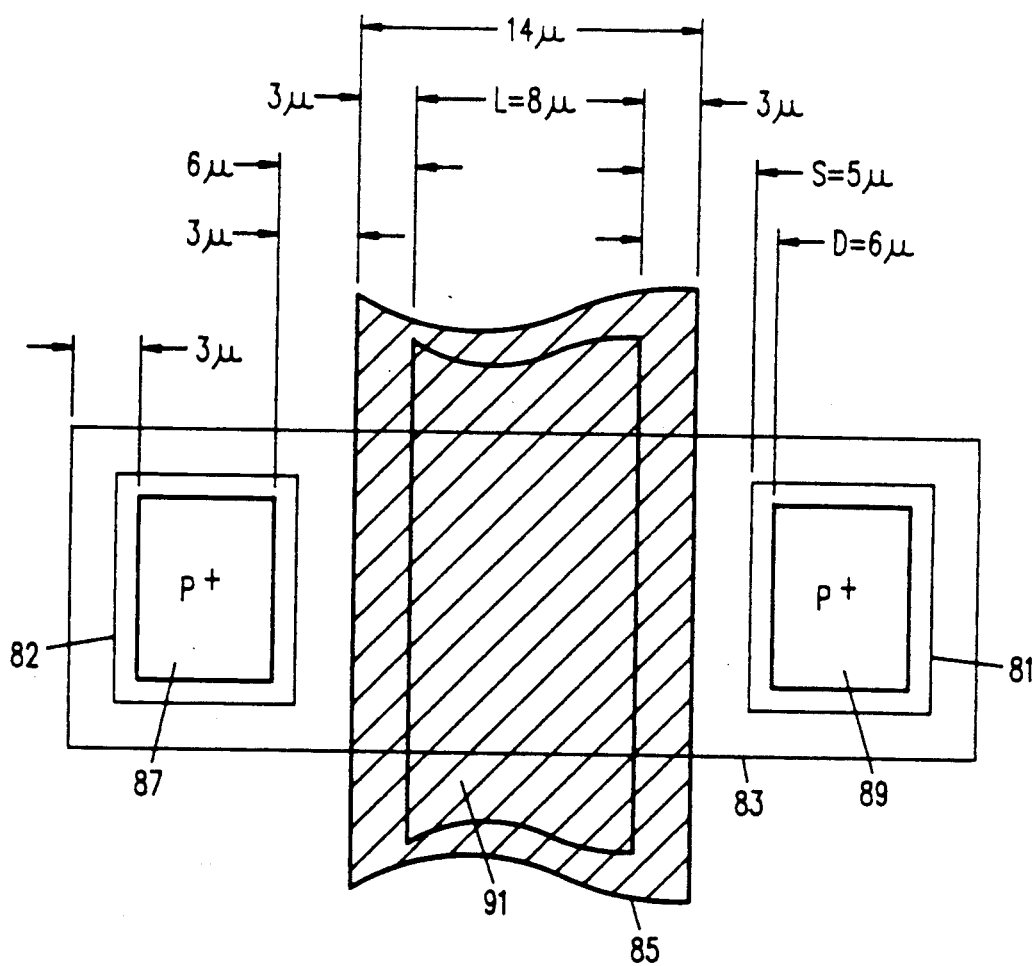
FIG. 9 is a top view of the present invention as shown in FIG. 8.

This completes the transistor, which is shown in top view in FIG. 9, with nominal key dimensions shown and including P− wells 81,82, boron field 83, polysilicon gate electrode 85, source 87, drain 89, and channel 91. The dimensions are shown in μm (microns). Dimension L is the channel length. Dimension S is the spacing from channel edge to P well. D is the drain extension length as determined by the boron field region 83. Thus, as shown in FIG. 9 the P— wells 82,81 respectively surround the source 87 and drain 89 regions at the principal surface of the device, and the boron field region 83 surrounds the P— wells 81,82 at the principal surface.

Figure 10:
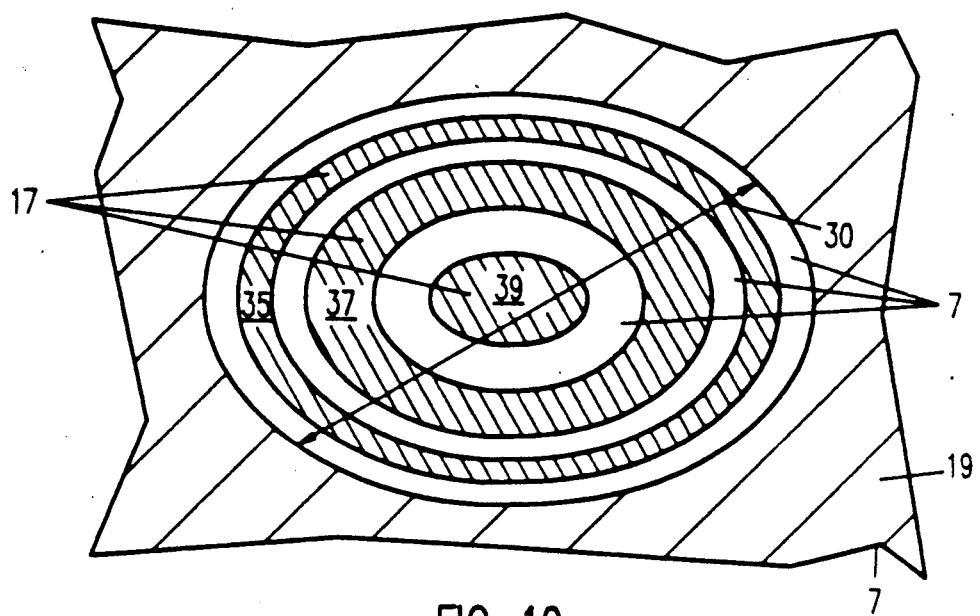
FIG. 10 is a top view of an oval configuration of the present invention.

In an alternate embodiment, the same series of process steps as described above forms a device having a circular or oval configuration as shown in top view in FIG. 10. The source/drain area 35, source/drain area 39, channel area 37, and boron field 30 correspond to the similarly referenced elements in the process step depicted for the rectangular configuration device shown in FIG. 3B. The P— wells are not shown in FIG. 10 for reasons of clarity. Principal surface 7 and source-drain masking layer 17 are also shown in FIG. 10.

In an alternate embodiment, the P— well 82 around the source 87 can be omitted. P— well 81 around drain 89 is needed to establish the desired breakdown voltage.

In yet another embodiment, after growth of field oxide 41 as shown in FIG. 5, gate silicon dioxide layer 51 is grown to a thickness of only about 1000 Å, instead of the 4000 Å thickness in the first embodiment. The thinner gate oxide in this embodiment means that $V_T$ (threshold voltage) is desirably lower than in the first embodiment, but the gate cannot withstand high voltages.

In another embodiment, the above process can be used to form a bipolar PNP transistor. In this version the same structure as shown in FIG. 8 is provided and the source 55 and drain 57 regions instead serve as the emitter and collector of the transistor, spaced apart by the self-aligned spacing on the active area (source-drain) mask. The transistor body (epitaxial layer 5) is the base, and the gate 53 which is not used is grounded to the emitter which is source region 55.

The above described embodiment of the invention is descriptive and not limiting, and further variations will be apparent to one skilled in the art. For instance, the invention is not limited to use with an epitaxial layer. The invention can be used for any process for forming P channel MOSFETS, including an N epitaxial layer on an N+ sublayer, an N sublayer with no epitaxial layer, or an N well CMOS on a P sublayer. Also, all polarities could be reversed and a high voltage N channel MOSFET fabricated in accordance with the invention.

I claim:

1. A semi self-aligned semiconductor device comprising:

a semiconductor body of a first conductivity type and having a principal surface;

a source region of a second conductivity type opposite the first conductivity type formed in the semiconductor body and extending to the principal surface of the semiconductor body;

a drain region of the second conductivity type formed in the semiconductor body spaced apart from the source region and extending to the principal surface of the semiconductor body;

a first deep well region of the second conductivity type formed in the semiconductor body surrounding the source region and having a doping level different than that of the source region;

a second deep well region of the second conductivity type formed in the semiconductor body surrounding the drain region and having a doping level different than that of the drain region;

a first field region of the second conductivity type formed in the semiconductor body having a doping level different than that of the source region and surrounding the source region at the principal surface and extending laterally beyond the first deep well region;

a second field region of the second conductivity type formed in the semiconductor body having a doping level different than that of the drain region and surrounding the drain region of the principal surface and extending laterally beyond the second deep well region;

a first field oxide region overlying the first field region;

a second field oxide region overlying the second field region and spaced apart from the first field oxide region;

only a single conductive gate layer overlying the principal surface and extending over said first and second field oxide regions; and a channel region having an effective length defined by a distance between the first and second field regions.

2. The device of claim 1, further comprising a layer of gate oxide between the conductive gate and the principal surface of the semiconductor body, said layer of gate oxide extending from said first field oxide region to said second field oxide region.

3. The device of claim 2, wherein the layer of gate oxide is at least 2000 Å thick.

4. The device of claim 2, further comprising a conductive layer in electrical contact with the drain region and extending over the layer of gate oxide.

5. The device of claim 1, wherein the first and second field regions are continuous in a plane of the principal surface.

6. The device of claim 5, wherein the first and second field regions are implanted boron.

7. The device of claim 1, whereby the source region, the drain region, and the semiconductor body respectively are the emitter, collector and base of a bipolar transistor.

* * * * *